United States Patent
Naba et al.

(10) Patent No.: US 12,396,092 B2
(45) Date of Patent: Aug. 19, 2025

(54) CERAMIC CIRCUIT BOARD AND SEMICONDUCTOR DEVICE USING SAME

(71) Applicants: KABUSHIKI KAISHA TOSHIBA, Tokyo (JP); TOSHIBA MATERIALS CO., LTD., Yokohama (JP)

(72) Inventors: Takayuki Naba, Chigasaki Kanagawa (JP); Keiichi Yano, Yokohama Kanagawa (JP); Hiromasa Kato, Nagareyama Chiba (JP)

(73) Assignees: KABUSHIKI KAISHA TOSHIBA, Tokyo (JP); TOSHIBA MATERIALS CO., LTD., Yokohama (JP)

(*) Notice: Subject to any disclaimer, the term of this patent is extended or adjusted under 35 U.S.C. 154(b) by 203 days.

(21) Appl. No.: 18/364,547

(22) Filed: Aug. 3, 2023

(65) Prior Publication Data

US 2023/0380060 A1    Nov. 23, 2023

Related U.S. Application Data

(63) Continuation of application No. PCT/JP2022/005407, filed on Feb. 10, 2022.

(30) Foreign Application Priority Data

Feb. 17, 2021    (JP) ................. 2021-023071

(51) Int. Cl.
  *H05K 1/03*    (2006.01)
  *H05K 1/02*    (2006.01)
  *H05K 3/38*    (2006.01)

(52) U.S. Cl.
  CPC ......... *H05K 1/0306* (2013.01); *H05K 1/0265* (2013.01); *H05K 1/0271* (2013.01); *H05K 3/388* (2013.01); *H05K 2201/06* (2013.01)

(58) Field of Classification Search
  CPC ...... H05K 1/03; H05K 1/0306; H05K 1/0265; H05K 1/0271; H05K 3/388; H05K 2201/06

(Continued)

(56) References Cited

U.S. PATENT DOCUMENTS

2014/0291699 A1    10/2014  Yano et al.
2018/0005918 A1    1/2018   Naba et al.

(Continued)

FOREIGN PATENT DOCUMENTS

| CN | 112166654 A | 1/2021 |
| JP | 2005005404 A | 1/2005 |
| WO | WO-2017056360 A1 | 4/2017 |

OTHER PUBLICATIONS

European Search Report issued Nov. 12, 2024 in corresponding European Patent Application No. 22756097.6.

(Continued)

*Primary Examiner* — Tremesha W Burns
(74) *Attorney, Agent, or Firm* — Harness, Dickey & Pierce, P.L.C.

(57) ABSTRACT

A ceramic circuit board includes a ceramic substrate and a metal plate bonded together via a bonding layer, wherein when the ceramic circuit board is observed through a cross-section defined by a thickness direction and lateral direction of the ceramic circuit board: a side surface of the metal plate has an inclined shape; and the bonding layer has a bonding-layer protruding portion which protrudes by 20 μm or more and 150 μm or less from an edge where the bonding layer is in contact with the side surface of the metal plate. The shape and Vickers hardness of the side surface of the metal plate are controlled. The ceramic substrate is preferably a silicon nitride substrate.

16 Claims, 6 Drawing Sheets

(58) Field of Classification Search
USPC .......................................................... 174/252
See application file for complete search history.

(56) References Cited

U.S. PATENT DOCUMENTS

| | | |
|---|---|---|
| 2019/0327831 A1 | 10/2019 | Kato et al. |
| 2020/0013696 A1 | 1/2020 | Naba et al. |
| 2021/0068253 A1 | 3/2021 | Kato et al. |
| 2022/0104350 A1 | 3/2022 | Kato et al. |
| 2022/0104351 A1 | 3/2022 | Kato et al. |

OTHER PUBLICATIONS

International Search Report issued in International Application No. PCT/JP2022/005407, mailed May 10, 2022.

CERAMIC CIRCUIT BOARD AND SEMICONDUCTOR DEVICE USING SAME

CROSS-REFERENCE TO RELATED APPLICATIONS

This application is a Continuation application of No. PCT/JP2022/005407, filed on Feb. 10, 2022, and the PCT application is based upon and claims the benefit of priority from Japanese Patent Application No. 2021-023071, filed on Feb. 17, 2021, the entire contents of which are incorporated herein by reference.

FIELD

Embodiments described later generally relate to a ceramic circuit board and a semiconductor device using the same.

BACKGROUND

This section provides background information related to the present disclosure which is not necessarily prior art.

A ceramic circuit board is used as a circuit board on which a semiconductor element is mounted. As a ceramic substrate, for example, an alumina substrate, an alumina-zirconia substrate, an aluminum nitride substrate, and a silicon nitride substrate are used. As a metal plate bonded to the ceramic substrate, a copper plate or an aluminum plate is used. Along with higher performance of semiconductor elements, a junction temperature has increased. Therefore, the ceramic circuit board is required to have improved TCT characteristics (thermal cycle resistance).

For example, International Publication No. WO 2017/056360 (Patent Document 1) describes the provision of an inclined structure on a side surface of the copper plate and the optimization of the size of a protruding portion of the bonding layer. In Patent Document 1, excellent TCT characteristics are obtained. In particular, it is preferable to optimize the size of the protruding portion of the bonding layer. In Patent Document 1, excellent TCT characteristics have been obtained.

The ceramic circuit board includes a semiconductor element mounted on a metal plate to form a semiconductor device. The metal plate on the side without a semiconductor element mounted thereon is bonded to a heat sink base. If necessary, wire bonding or lead bonding is performed. The semiconductor element is molded with resin for protection. For the resin molding, methods such as a potting method and a transfer molding method are employed. A mold resin, which is formed by resin molding that hardens the resin, serves to protect the semiconductor element.

When resin was molded on a semiconductor device using the ceramic circuit board of Patent Document 1, a phenomenon of resin peeling was observed in some cases. Along with higher performance of semiconductor elements, the amount of generated heat has increased. As a result, it has been found that the resin peeling is likely to occur at a contact surface between the mold resin and the ceramic circuit board.

The present invention is to cope with such a problem and to provide a ceramic circuit board capable of suppressing resin peeling of a mold resin.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Hereinafter, embodiments of a ceramic circuit board and a semiconductor device using the same are described in detail with reference to the drawings.

The ceramic circuit board according to an embodiment, in which a ceramic substrate and a metal plate are bonded to each other via a bonding layer, has the following features when the ceramic circuit board is observed through a cross-section defined by a thickness direction and lateral direction of the ceramic circuit board:

(1) a side surface of the metal plate has an inclined shape;

(2) the bonding layer has a bonding-layer protruding portion which protrudes by 20 μm or more and 150 μm or less from an edge where the bonding layer is in contact with the side surface of the metal plate;

(3) an angle BAC is 110 degrees or more, where a point A is on the edge, point B is on a side surface of the metal plate that is 20 μm away from the point A inward in the lateral direction, and a point C is on a surface of the bonding layer protruding portion that is 20 μm away from the point A outward in the lateral direction;

(4) when Hm denotes an average value of Vickers hardness at ten locations in a region between a line in the lateral direction passing through the point B and an interface between the metal plate and the bonding layer;

(5) 300>Hm>Hb and Hm/Hb<2, where Hb denotes an average value of Vickers hardness at ten locations in the bonding layer; and (6) a ratio R of an area where a component of the bonding layer other than that of the metal plate is present in the region is 5% or more and 20% or less.

That is, it is suitable to satisfy requirements of the above features (1) to (6) in the cross-section defined by the thickness direction and lateral direction of the ceramic circuit board (when the planar shape of the ceramic circuit board is rectangular, each lateral direction is each of two lateral directions orthogonal to each other). Note that, when the metal plate is bonded only to one surface of the ceramic circuit board, only the metal plate and bonding layer on the one surface need to satisfy the requirements of the above features (1) to (6), and when the metal plate is bonded to both surfaces of the ceramic circuit board, the metal plate and the bonding layer on both of the surfaces need to satisfy the requirements of the above features (1) to (6).

Figure 1:
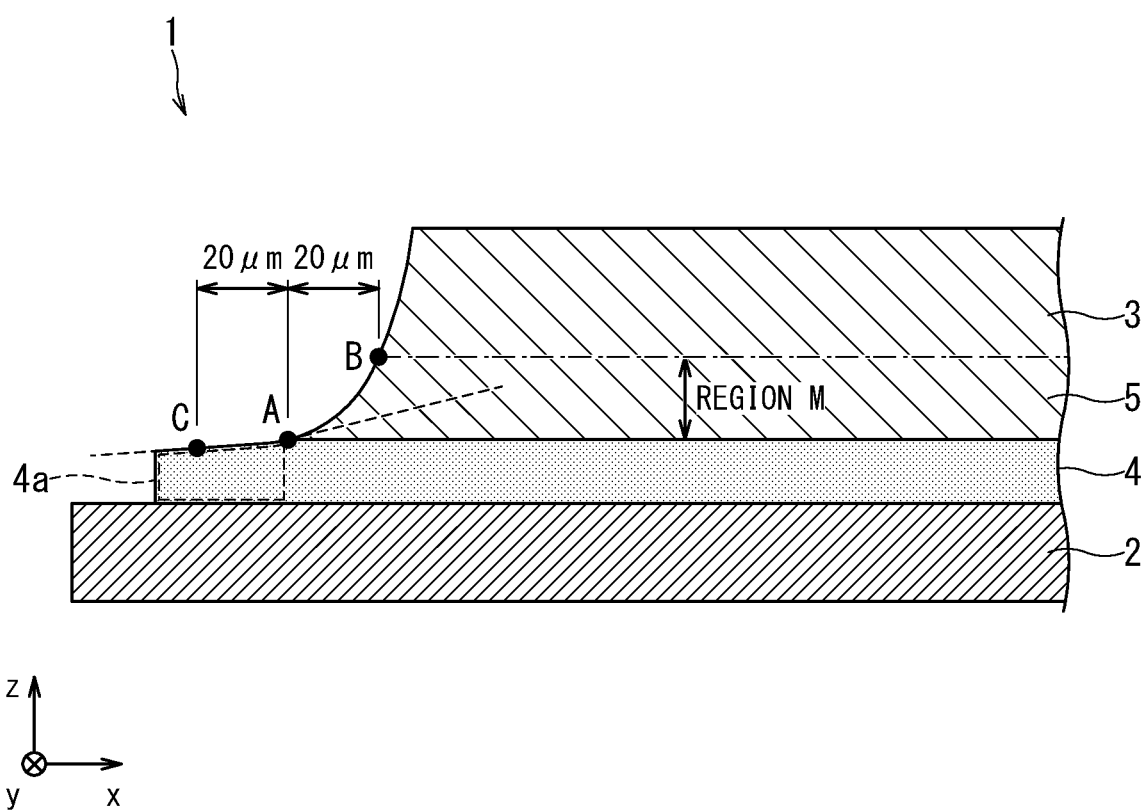
FIG. 1 is a I-I cross-sectional view showing a first example of a ceramic circuit board according to an embodiment.
Figure 2A:
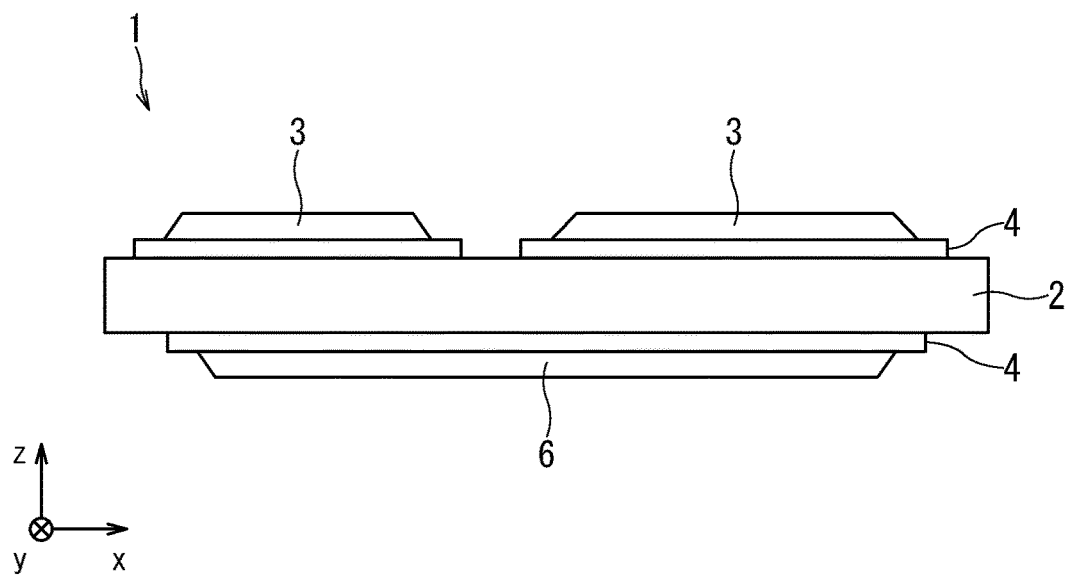
FIG. 2A is a side view showing an outline of a ceramic circuit board according to an embodiment.
Figure 2B:
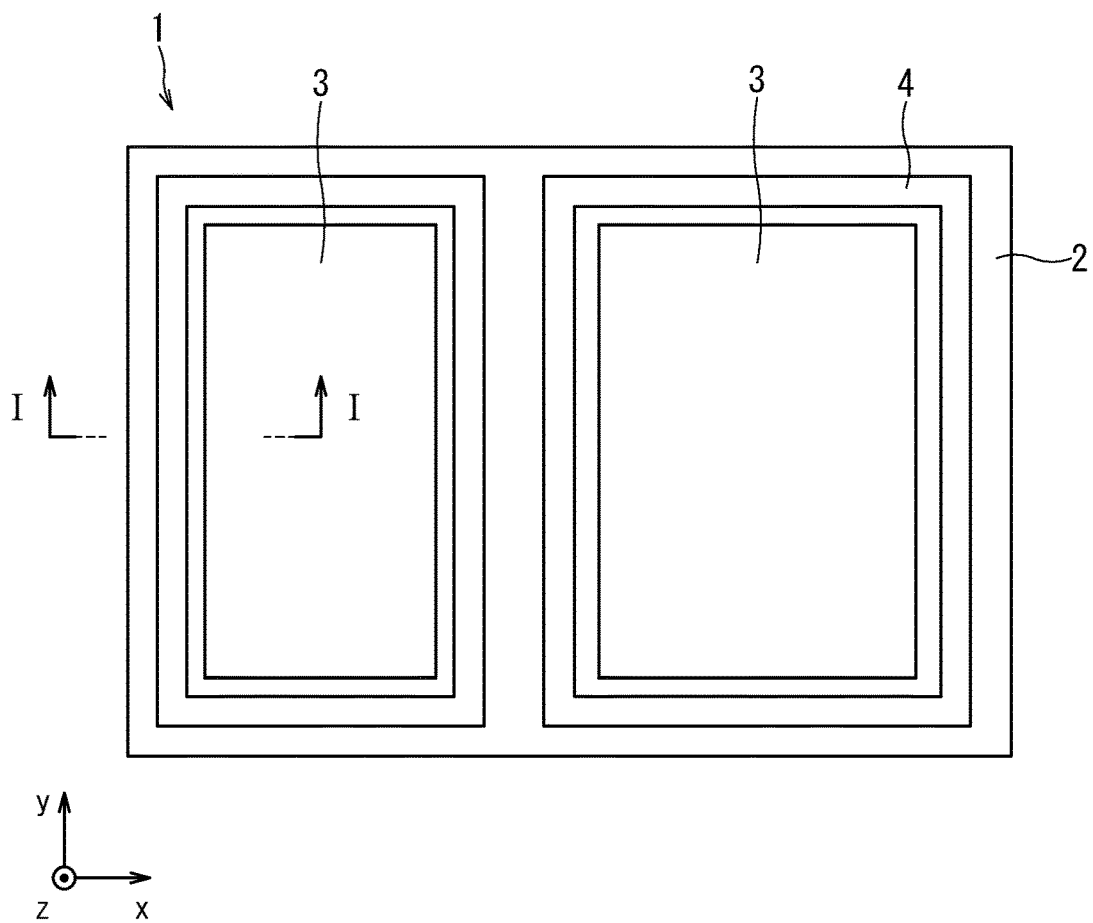
FIG. 2B is a top view showing an outline of a ceramic circuit board according to an embodiment.

FIG. 1, FIG. 2A, and FIG. 2B are cross-sectional views showing the details of the ceramic circuit board according to the embodiment. In the figures, reference numeral 1 denotes a ceramic circuit board, reference numeral 2 denotes a ceramic substrate, reference numeral 3 denotes a metal plate, reference numeral 4 denotes a bonding layer, reference numeral 5 denotes a region M, and reference numeral 6 denotes a metal plate. Although FIG. 1 is a I-I cross-sectional view of FIG. 2B, the bonding layer 4 and the rear metal plate 6 on the rear side of the ceramic circuit board 2 is omitted in FIG. 1. The lateral directions of the ceramic substrate 2 are defined as an x-axis direction and a y-axis direction, and the depth direction of the ceramic substrate 2 is defined as a z-axis direction.

FIG. 1 illustrates a side surface shape of the metal plate 3 provided on the front side of the ceramic circuit board 1 (the metal plate 6 on the rear side is omitted). FIGS. 2(A) and 2(B) each show the structure of the ceramic circuit board 1 with two metal plates 3 on the front side and one metal plate 6 on the rear side. Since the metal plate 3 on the front side is used as a circuit, it may be called a front metal plate. Since the metal plate 6 on the rear side is used as a heat dissipation plate, it may be called a rear metal plate. The ceramic circuit board 1 according to the embodiment is not limited to such a structure. For example, three or more front metal plates 3 may be provided. Further, the rear metal plate 6 may be provided in a circuit shape. Hereinafter, a case where the metal plates 3 and 6 are bonded to both sides of the ceramic circuit board 1 will be described as an example.

First, the ceramic substrate 2 is preferably selected from one of a silicon nitride substrate, an aluminum nitride substrate, an alumina substrate, and an alumina-zirconia substrate. Note that the alumina-zirconia substrate is made of a ceramic sintered body in which alumina and zirconia are mixed.

When the ceramic substrate 2 is a silicon nitride substrate, the silicon nitride substrate preferably has a three-point bending strength of 600 MPa or more. The silicon nitride substrate preferably has a thermal conductivity of 80 W/m·K or more. By increasing the strength of the silicon nitride substrate, the substrates thickness can be reduced. For this reason, the three-point bending strength of the silicon nitride substrate is preferably 600 Mpa or more and more preferably 700 Mpa or more. The thickness of the silicon nitride substrate can be reduced to 0.40 mm or less and further to 0.30 mm or less.

When the ceramic substrate 2 is an aluminum nitride substrate, the aluminum nitride substrate has a three-point bending strength of approximately 300 to 450 Mpa. Meanwhile, the aluminum nitride substrate has a thermal conductivity of 160 W/m·K or more. Since the aluminum nitride substrate has low strength, the substrate thickness is preferably 0.60 mm or more.

When the ceramic substrate 2 is an aluminum oxide substrate, the aluminum oxide substrate has a three-point bending strength of approximately 300 to 450 Mpa but is inexpensive. When the ceramic substrate 2 is an alumina-zirconia substrate, the three-point bending strength of the alumina-zirconia substrate is as high as approximately 550 Mpa, but the thermal conductivity is approximately 30 to 50 W/m·K.

Note that the ceramic substrate 2 is preferably a silicon nitride substrate. Since the silicon nitride substrate has high strength, it can be made thinner.

Examples of the metal plates 3 and 6 include one or more selected from a copper plate, a copper alloy plate, an aluminum plate, and an aluminum alloy plate. The metal plates 3 and 6 are preferably copper plates. The metal plates 3 and 6 are preferably oxygen-free copper plates. Oxygen-free copper has a copper purity of 99.96% by mass or more as specified in JIS-H-3100. The thermal conductivity of copper is about 400 W/m·K, and the thermal conductivity of aluminum is about 240 W/m·K. Copper has a higher thermal conductivity than aluminum, which improves heat dissipation. The aluminum plate is preferably made of pure aluminum. Pure aluminum is specified in JIS-H-4000. ISO corresponding to JIS-H-3100 is ISO 1337 (1980), for example. ISO corresponding to JIS-H-4000 is ISO 209-1 (1989), for example.

The metal plates 3 and 6 each have a thickness of 0.3 mm or more. By increasing the thickness of the metal plates 3 and 6, heat dissipation can be improved. The current carrying capacity can also be increased. Therefore, the thickness of the metal plates 3 and 6 is preferably 0.3 mm or more and more preferably 0.6 mm or more. The upper limit of the thickness of the metal plates 3 and 6 is not particularly limited but is preferably 5 mm or less. If the thickness exceeds 5 mm, it may be difficult to control the inclined shape of the side surfaces of the metal plates 3 and 6. From the viewpoint of heat dispersion, a copper plate having a thickness of 0.3 mm or more is preferably used as each of the metal plates 3 and 6. In addition, both the front copper plate as the front metal plate 3 and the rear copper plate as the rear metal plate 6 preferably have a thickness of 0.3 mm or more.

The front metal plate 3 and the rear metal plate 6 are each bonded to the ceramic substrate 2 via the bonding layer 4. The bonding layer 4 has a bonding-layer protruding portion 4a which protrudes from an edge (shown as point in the cross-sectional view in FIG. 1) where the bonding layer 4 is in contact with the side surface of the front metal plate 3.

The bonding-layer protruding portion 4a has a protruding length (hereinafter, simply referred to as a "length") of 20 μm or more and 150 μm or less. The length of the bonding-layer protruding portion 4a is measured using an arbitrary cross section of the ceramic circuit board 1. The cross section is observed with a scanning electron microscope (SEM). A magnification of a SEM photograph is 500 times. The length of the bonding-layer protruding portion 4a is determined using the SEM photograph. The length of the bonding-layer protruding portion 4a is determined based on contact points between the bonding layer 4 and the front metal plate 3 and that between the edge of the bonding-layer protruding portion 4a and the ceramic substrate 2. The same applies to the rear metal plate 6 like the front metal plate 3. The contact point between the bonding layer 4 and the front metal plate 3 is defined as a reference 1, and the contact point between the edge of the bonding-layer protruding portion 4a and the ceramic substrate 2 is defined as a reference 2. Vertical lines (lines extending in the z-axis direction) respectively passing through each of the reference 1 and the reference 2 are drawn, and the horizontal distance (distance in the x-axis direction or y-axis direction) between the vertical lines is taken as the length of the bonding-layer protruding portion 4a. Even if the front metal plate 3 has a metal coating on the side surface, the measurement is performed with reference to the side surface of the front metal plate 3 itself. Examples of the metal coating include metal plating.

When the length of the bonding-layer protruding portion 4a is 20 μm or more and 150 μm or less, the TCT characteristics can be improved. In a case where the length of the bonding-layer protruding portion 4a is less than 20 μm, the stress relaxation effect is insufficient at the bonding edge. If it is longer than 150 µm, no further effect can be obtained. In addition, if the bonding-layer protruding portion 4a is too long, it may be difficult to narrow the pitch between adjacent front metal plates 3 (or rear metal plates 6). Therefore, the length of the bonding-layer protruding portion 4a is preferably 20 µm or more and 150 µm or less, more preferably 20 µm or more and 80 µm or less, and still more preferably 30 µm or more and 60 µm or less.

The bonding-layer protruding portion 4a may have a structure of uniform thickness or a structure in which the thickness decreases toward the tip.

The angle BAC is 110 degrees or more, where the point A is on the edge (shown as point in the cross-sectional view in FIG. 1) where the bonding layer 4 is in contact with the side surface of the front metal plate 3, the point B is on the side surface of the front metal plate 3 that is 20 µm away from the point A toward the inside in the x-axis direction (i.e., the positive x-axis direction shown in FIG. 1), and the point C is a contact point on the surface of the bonding-layer protruding portion 4a that is 20 µm away from the point A toward the outside in the x-axis direction (i.e., the negative x-axis direction shown in FIG. 1).

Measurements of the points A, B and C are to be made using SEM photographs of the cross sections. In the SEM photographs, the point A denotes a point where the bonding layer 4 is in contact with the side surface of the front metal plate 3. The point B is on the side surface of the front metal plate 3 that is 20 µm away from the point A toward the inside in the x-axis direction. The point C denotes a contact point on the top surface of the bonding-layer protruding portion 4a that is 20 µm away from the point A toward the outside in the x-axis direction. The points B and A are connected with a straight line. Similarly, the points A and C are connected with a straight line. The angle BAC is defined as an angle formed by each straight line. The angle BAC is the angle formed by the line BA connecting the point B and the point A with a straight line and the line AC connecting the point A and point C with a straight line, which is the angle formed on the upper side of FIG. 1.

When the angle BAC is 110 degrees or more, stresses applied to the bonding-layer protruding portion 4a can be reduced. This means that the angle is sufficient in the minute region 20 µm away from the point A. Further, when resin is molded, the adhesion between the side surface of the front metal plate 3 and the mold resin 8 can be improved.

When the angle BAC is less than 110 degrees, the angle of the side surface of the metal plate is steep. The thicker the bonding-layer protruding portion 4a becomes toward the outside, the smaller the angle BAC becomes. In such a shape, stresses applied to the bonding-layer protruding portion 4a are increased. In addition, a gap is likely to be formed between the side surface of the front metal plate 3 and the mold resin 8.

The upper limit of the angle BAC is not particularly limited but is preferably 180 degrees or less. If the angle is larger than 180 degrees, the side surface of the front metal plate 3 is so inclined that the area for mounting the semiconductor element 7 (shown in FIG. 3) may be reduced. In a case where the angle BAC exceeds 180 degrees, the bonding-layer protruding portion 4a is long and becomes thinner toward the tip. In addition, if the bonding-layer protruding portion 4a is long, it may be difficult to narrow the pitch between adjacent front metal plates 3 (or rear metal plates 6). Therefore, the angle BAC is preferably 110 degrees or more and 180 degrees or less, and more preferably 130 degrees or more and 160 degrees or less.

Figure 5:
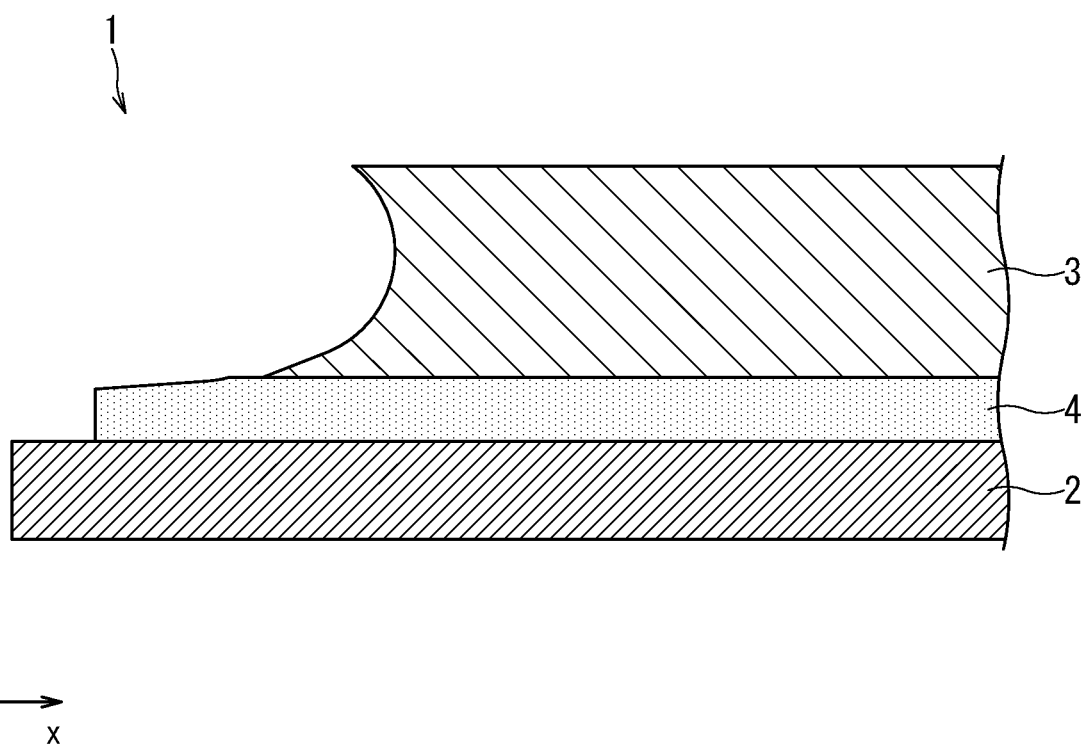
FIG. 5 is a I-I cross-sectional view showing a second example of a ceramic circuit board according to an embodiment.
Figure 6:
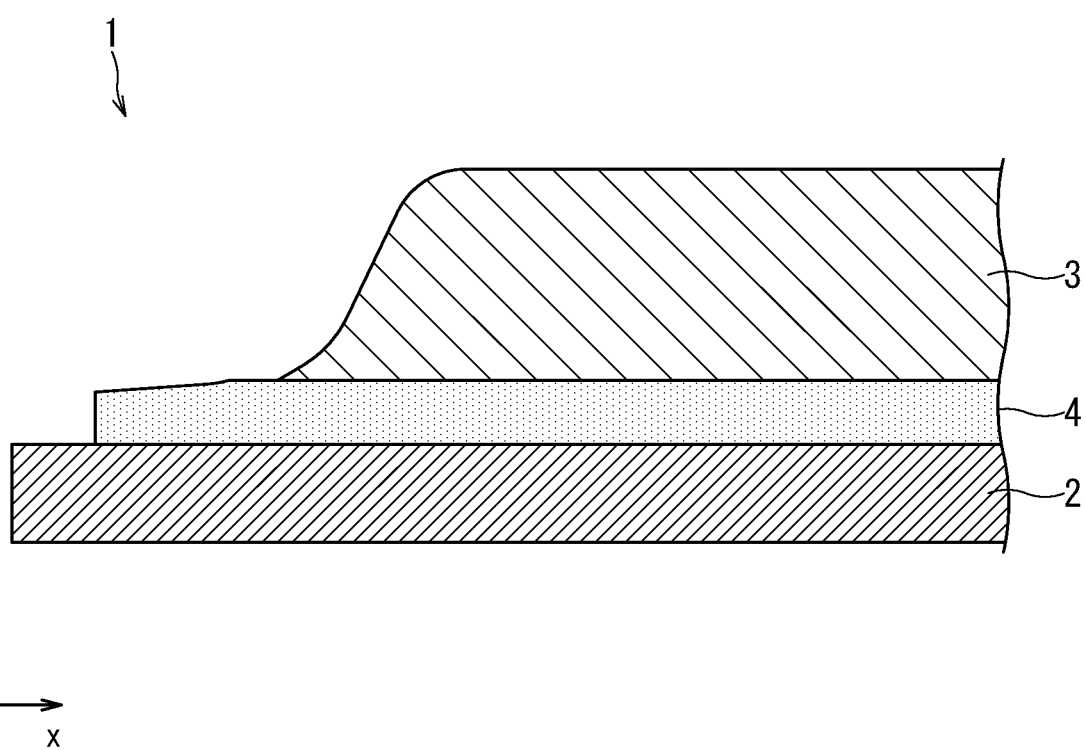
FIG. 6 is a I-I cross-sectional view showing a third example of a ceramic circuit board according to an embodiment.

As shown in FIG. 1, the side surface of the front metal plate 3 may have an inclined shape that becomes wider as it advances in the negative direction of the z-axis, or as shown in FIG. 5, the side surface of the front metal plate 3 may have an arc shape that becomes wider as it advances in the positive and negative directions of the z-axis. By adjusting the angle BAC to 110 degrees or more and making the side surface of the front metal plate 3 arc-shaped, it is possible to achieve both stress relaxation and a larger mounting area for the semiconductor element 7 (shown in FIG. 3). Besides, peeling of the mold resin can be suppressed when the resin is molded. FIG. 5 shows a second example of the ceramic circuit board 1 in which at least one of the side surfaces of the metal plates 3 and 6, for example, the side surface of the front metal plate 3 has an arc shape. FIG. 6 shows a third example of the ceramic circuit board 1 in which the side surface of the front metal plate 3 and the connection portion on the surface have an R shape. Although FIGS. 5 and 6 are I-I cross-sectional views of FIG. 2B, the bonding layer 4 and the rear metal plate 6 on the rear side of the ceramic circuit board 2 are omitted in FIGS. 5 and 6.

As shown in FIG. 5, when the side surface of the front metal plate 3 has an arc shape, the front surface of the front metal plate 3 is extended in the x-axis direction and the y-axis direction. As a result, a flat portion is increased on the surface of the front metal plate 3, thereby increasing the mounting area of the semiconductor element 7. On the other hand, as shown in FIG. 6, when the connection portion between the side surface and the front surface of the front metal plate 3 has an R shape, the surface of the front metal plate 3 and the surface of the rear metal plate 6 have a smaller flat portion, and thus the mounting area cannot be increased.

The side surface of the front metal plate 3 shown in FIG. 5 may be slightly uneven when viewed in the aforementioned cross-sectional SEM photograph (500 times), which should be fine. If the upper edge of the side surface of the front metal plate 3 shown in FIG. 5 is extended outward, it should be called as an arc shape.

Returning to the description of FIG. 1, the region M is defined as a region between a plane passing through the point B, which is parallel to the plane (x-y plane) of the ceramic substrate 2, and the interface between the front metal plate 3 and the bonding layer 4. The region M has the following features of: 300>Hm>Hb, and Hm/Hb<2, where Hm denotes the average value of Vickers hardness at ten locations in the region M, and Hb denotes the average value of Vickers hardness at ten locations in the bonding layer 4; the ratio R of the area where components of the bonding layer 4 other than those of the front metal plate 3 being present in the region M is 5% or more and 20% or less.

The region M is a region between a line in the x-axis direction passing through the point B and an interface between the front metal plate 3 and the bonding layer 4. The interface between the front metal plate 3 and the bonding layer 4 is defined as a portion where the components other than the front metal plate 3 reaches 8% by mass or more.

For example, when a copper plate is used as the front metal plate 3, the interface between the copper plate and the bonding layer 4 is defined as a portion where the concentration of the components other than copper in the copper plate reaches 8% by mass. The interface between the copper plate and the bonding layer 4 is also defined as a portion where the total concentration of two or more components other than that of the front metal plate 3 being present reaches 8% by mass. The interface between the front metal plate 3 and the bonding layer 4 is measured by point analysis of SEM-EDX (energy dispersive X-ray spectroscopy).

The average value of Vickers hardness at ten locations in the region M is defined as Hm, and the average value of Vickers hardness at ten locations in the bonding layer 4 is defined as Hb. The Vickers hardness is measured in accordance with JIS-Z-2244 (2009). An arbitrary cross section of a ceramic circuit board 1 is used as a sample. A measurement surface of the sample has a surface roughness Ra of 1 μm or less. The measurement surface of the sample may be polished, if necessary. A test force (F) to be applied is 9.807 N. The Vickers hardness may be measured by a nanoindentation method. The measurement method by the nanoindentation method is as described in Patent Document 1. ISO corresponding to JIS-Z-2244 is ISO 6507.

The Vickers hardness of any ten locations in the region M is measured and the average value is denoted as Hm. Similarly, the average value of the Vickers hardness at any ten locations in the bonding layer is denoted as Hb.

In addition, 300>Hm>Hb and Hm/Hb<2 should be satisfied. 300>Hm>Hb indicates that Hm and Hb have a Vickers hardness of less than 300 and also indicates that the Vickers hardness Hb of the bonding layer 4 is lower than the Vickers hardness Hm of the region M. Hm/Hb<2 indicates that the Vickers hardness Hm of the region M is less than twice the Vickers hardness Hb of the bonding layer 4. This indicates that the difference in hardness between the region M and the bonding layer 4 is small, whereby the stress generated in bonding-layer protruding portion 4a can be relieved. Moreover, the resin peeling can be suppressed when the resin is molded because the amount of deformation caused by the deformation of the mold resin 8 (shown in FIG. 3) can be reduced.

The bonding layer 4 preferably has a Vickers hardness Hb of 90 or more and 200 or less. When the Vickers hardness Hb is in the range of 90 or more and 200 or less, the relationship between Hm and Hb is easily controlled.

The components of the bonding layer 4 other than the those of the front metal plate 3 in the region M are preferably one or more selected from silver (Ag), titanium (Ti), tin (Sn), indium (In), zirconium (Zr), aluminum (Al), silicon (Si), carbon (C), and magnesium (Mg). The components of the bonding layer 4 other than those of the front metal plate 3 in the region M are components different from the front metal plate 3 among constituent components of the bonding layer 4. In other words, the bonding layer 4 contains one or more elements selected from Ag, Ti, Sn, In, Zr, Al, Si, C, and Mg. Note that it is denoted as a point C when determining the aforementioned angle BAC. Carbon in the bonding layer 4 is denoted as C.

As described later, when the front metal plate 3 is bonded to the ceramic substrate 2 via the bonding layer 4, a heat bonding step is performed. The components of the bonding layer 4 diffuse into the front metal plate 3 by heating. This makes it possible to control Hm and Hb. As describe above, the interface between the front metal plate 3 and the bonding layer 4 is a portion where the components other than that of the front metal plate 3 have reached 8% by mass. The region M preferably contains one or more elements selected from Ag, Ti, Sn, In, Zr, Al, Si, C, and Mg in total of 1% by mass or more.

The ratio R of the area where components of the bonding layer 4 other than those of the front metal plate 3 being present in the region M is 5% or more and 20% or less. In order to control the Vickers hardness of region M, it is effective to control the ratio of the area where the components of the bonding layer 4 other than those of the front metal plate 3 are present in the region M. The components of the bonding layer 4 other than those of the front metal plate 3 in the region M are one or more selected from Ag, Ti, Sn, In, Zr, Al, Si, C, and Mg.

The measurement of the ratio R in the region M is to be made using area analysis of SEM-EDX. The area analysis is also referred to as surface analysis. In an arbitrary cross section of the ceramic circuit board 1, a measurement region is set to have a width of 50 μm and a thickness of 20 μm in the region M. The width of 50 μm is in the width direction of the region M. The thickness of 20 μm is within the range of 20 μm towards the bonding layer side from the reference line passing through the point B in the x-axis direction when determining the region M.

When the ratio R is in the range of 5% or more and 20% or less, it is possible to control Hm and Hb. The distribution of the bonding layer components other than the metal plate components in the region M can improve the reliability of the bonding. It is assumed that the ratio R may be measured at any one location. In other words, the ratio R is preferably in the range of 5% or more and 20% or less no matter where in the region M is measured.

The ceramic circuit board 1 as described above can improve the TCT characteristics. Besides, the ceramic circuit board 1 can suppress resin peeling when a resin is molded. Thus, it is suitable for a semiconductor device in which semiconductor elements are mounted on the ceramic circuit board 1.

Figure 3:
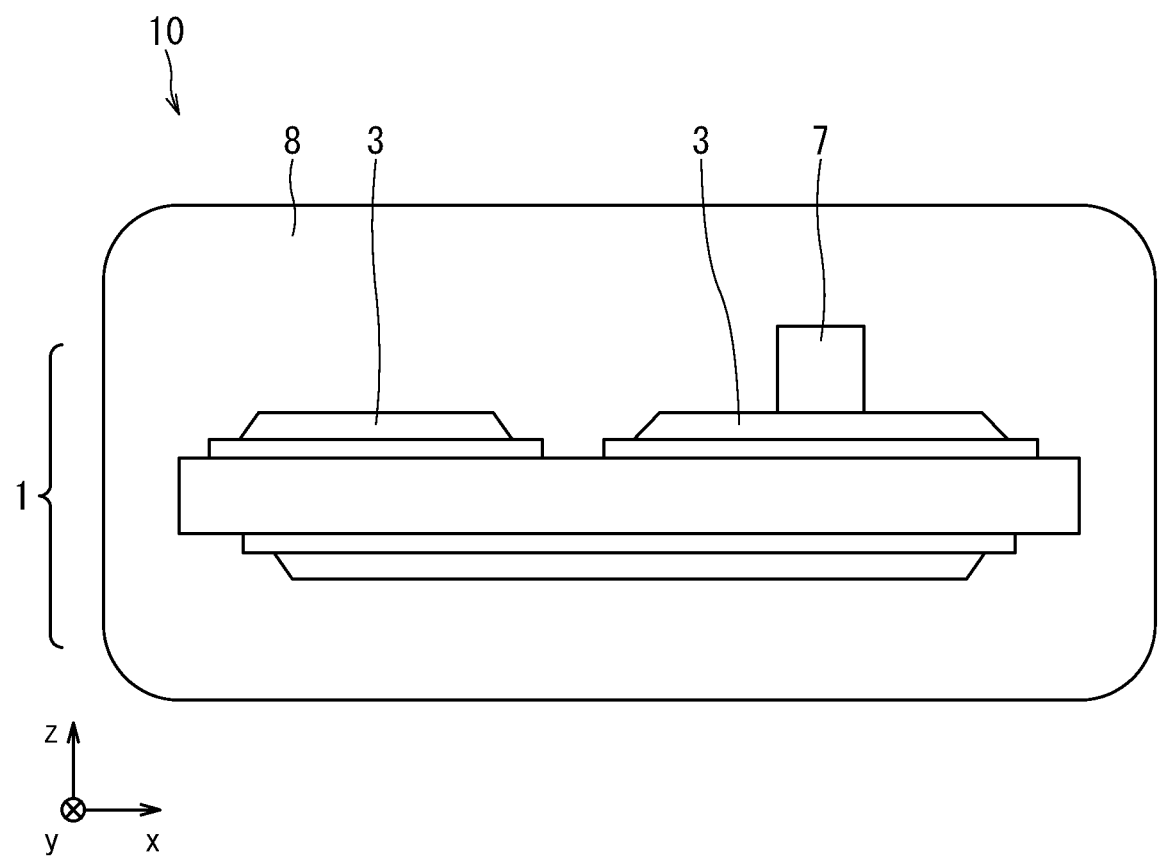
FIG. 3 is a side view showing an example of a semiconductor device according to an embodiment.

FIG. 3 shows an example of a semiconductor device according to the embodiment. In the figure, reference numerical 1 denotes a ceramic circuit board, reference numerical 7 denotes a semiconductor element, reference numerical 8 denotes a mold resin, and reference numerical 10 denotes a semiconductor device. FIG. 3 shows an example in which one semiconductor element is mounted, but two or more may be mounted. Although not shown in the figure, a lead frame, wire bonding, or screw fixing structure, for example, may be provided. Although FIG. 3 shows the example in which the resin is molded on the entire semiconductor device 10 to form the mold resin 8, the resin may be molded only on the surface on which the semiconductor element 7 is mounted to form the mold resin 8.

The ceramic circuit board 1 according to the embodiment has excellent TCT characteristics. In addition, the resin of the mold resin 8 on the side surfaces of the metal plates 3 and 6 is not easily peeled off. Therefore, the reliability of the semiconductor device 10 provided with the mold resin 8 can be improved.

Then, a method of manufacturing the ceramic circuit board 1 according to the embodiment will be described. The method of manufacturing the ceramic circuit board 1 according to the embodiment is not limited as long as it has the above configuration, but the following methods can be employed to obtain a high yield.

First, a ceramic substrate 2 is prepared. The ceramic substrate 2 is preferably one selected from a silicon nitride substrate, an aluminum nitride substrate, an alumina substrate, and an alumina-zirconia substrate.

The ceramic substrate 2 is preferably a silicon nitride substrate having a thermal conductivity of 80 W/m·K or more. The silicon nitride substrate preferably has a three-point bending strength of 600 MPa or more. By increasing the strength of the silicon nitride substrate, the substrate thickness can be reduced.

Next, metal plates 3 and 6 are prepared. The metal plates 3 and 6 are preferably copper or aluminum plates. The copper plates are preferably oxygen-free copper plates. The aluminum plates are preferably pure aluminum plates. The metal plates 3 and 6 each preferably have a thickness of 0.3 mm or more.

Next, a brazing material that serves as the bonding layer 4 is prepared.

When a copper plate is used as the bonding layer 4, it is preferably a brazing material containing silver (Ag) or copper (Cu) as the main component and titanium (Ti). The brazing material containing Ti is called an active metal brazing material. The active metal brazing material can improve the bonding strength as Ti reacts with the ceramic substrate 2 to form a reaction layer. When the ceramic substrate 2 is a nitride-based ceramic substrate, the reaction layer contains titanium nitride as a main component. The nitride-based ceramic substrate includes a silicon nitride substrate and an aluminum nitride substrate. When ceramic substrate 2 is an oxide-based ceramic substrate, the reaction layer contains titanium oxide as a main component. The oxide-based ceramic substrate includes an aluminum oxide substrate and an alumina-zirconia substrate.

The brazing material composition preferably contains silver (Ag) in an amount of 0% by mass or more and 60% by mass or less, copper (Cu) in an amount of 15% by mass or more and 85% by mass or less, and titanium (Ti) or titanium hydride ($TiH_2$) in an amount of 1% by mass or more and 15% by mass or less. When both Ti and $TiH_2$ are used, the total content is in the range of 1% by mass or more and 15% by mass or less. When both Ag and Cu are used, the Ag content is preferably 20 to 60% by mass, and the Cu content is preferably 15 to 40% by mass.

The brazing material composition may contain one or two of tin (Sn) and indium (In), if necessary, in an amount of 1% by mass or more and 50% by mass or less. The content of Ti or $TiH_2$ is preferably 1% by mass or more and 15% by mass or less, and more preferably 1% by mass or more and 6% by mass or less. If necessary, carbon (C) may be contained in an amount of 0.1% by mass or more and 2% by mass or less. If necessary, one or more selected from Zr, Al, Si, and Mg may be contained in an amount of 0.1% by mass or more and 5% by mass or less.

The ratio of the brazing material composition is calculated by considering the total of raw materials to be mixed is 100% by mass. For example, if it is composed of Ag, Cu, and Ti, it will be Ag+Cu+Ti=100% by mass. If the material is composed of Ag, Cu, $TiH_2$, and In, it will be Ag+Cu+$TiH_2$+In=100% by mass. If the material is composed of Ag, Cu, Ti, Sn, and C, it will be Ag+Cu+Ti+Sn+C=100% by mass.

When an aluminum plate is used, it is preferably a brazing material containing aluminum (Al) as the main component and silicon (Si) or magnesium (Mg). The content of Si is preferably in the range of 0.1% by mass or more and 20% by mass or less. The content of Mg is preferably in the range of 0.1% by mass or more and 20% by mass or less. The brazing material may also contain both Si and Mg. The ratio of the brazing material composition is calculated by considering the total of raw materials to be mixed is 100% by mass. For example, if it is composed of Al and Si, it will be Al+Si=100% by mass. If the material is composed of Al, Si, and Mg, Al+Si+Mg=100% by mass.

After the brazing material components are mixed, a binder and the like are added to prepare a brazing material paste. The brazing material paste is applied onto the ceramic substrate, and the front metal plate 3 is disposed thereon. If the metal plates 3 and 6 are expected to be respectively bonded to both surfaces of the ceramic substrate 2, the brazing material paste is applied to both surfaces of the ceramic substrate 2, and then the metal plates 3 and 6 are disposed thereon. Through this step, a laminate of the ceramic substrate 2, the brazing material paste, and the metal plates 3 and 6 can be prepared. In the state of the laminate, it is preferable that the ceramic substrate 2 and the metal plates 3 and 6 have substantially the same vertical and horizontal sizes. Being substantially the same means being within a range of plus or minus 2 mm.

The thickness of the brazing material paste applied is preferably 10 μm or more and 60 μm or less. In addition, it is preferable to perform a drying step after applying the brazing material paste onto the ceramic substrate 2. The drying step is a heat treatment within the range of 40 degrees Celsius or more and 80 degrees Celsius or less. Low drying temperature may result in insufficient removal of binder and solvent components. Further, high drying temperature may cause the brazing material to be oxidized. By performing the drying step, the contact between the brazing material components and the front metal plate 3 can be homogenized.

Thus, the uniformity of the diffusion state of the brazing material components can be improved. The remaining binder components in the drying step may be removed during a temperature raising step of the heat bonding step.

Next, a heat bonding step is performed. The heating temperature is preferably in the range of 600 degrees Celsius or more and 960 degrees Celsius or less. The atmosphere is preferably a vacuum or an inert gas. The vacuum is $10^{-3}$ Pa or less. Examples of the inert gas include nitrogen gas and argon gas. The term "in nitrogen" refers to an atmosphere having a nitrogen content of 80% by volume or more.

In the heat bonding step, a load is preferably applied to a laminate. The load is preferably in a range of 500 Pa or more and 2,000 Pa or less. This allows brazing material metal components to diffuse into the metal plate in a proper amount and to homogenize it.

The cooling rate after the heat bonding step is preferably 5 [degrees Celsius/min] or more. By increasing the cooling rate, solidification of the brazing material can be accelerated. Thus, the Vickers hardness of the bonding layer 4 can be made homogeneous.

In the front metal plate 3, the number of triple points between metal crystal grains in a unit area of 1 mm×1 mm is preferably in the range of 20 or more and 150 or less. The number of triple points is determined by observing the surface of the front metal plate 3 with a metallurgical microscope. When it is difficult to confirm metal crystal grains, the surface of the front metal plate 3 may be subjected to etching treatment. If the front metal plate 3 is a copper plate, copper crystal grains form a triple point. If the front metal plate 3 is an aluminum plate, aluminum crystal grains form a triple point.

The triple point between metal crystal grains is more likely to be a route for diffusion of the brazing material than between two metal crystal grains. By increasing the number of the three points, the route for diffusion of the brazing material can be formed into a complex maze. Thus, the amount of diffusion can be controlled. The number of triple points of the metal plate is the number of triple points of the front metal plate 3 after bonding. By performing a heat bonding step, the crystal grains of the front metal plate 3 grow. When the number of triple points after bonding is within the above range, the diffusion route of the brazing material can be controlled. When the number of triple points between metal crystal grains is less than 20 in a unit area of 1 mm×1 mm, the diffusion route becomes smooth because of the small number of triple points. Smoother diffusion may increase the amount of diffusion. If the number of triple points exceeds 150, the diffusion route becomes complicated, but the amount of diffusion may increase because the diffusion route itself increases. When the diffusion amount increases, the ratio R is more likely to exceed 20%. For this reason, in the metal plates 3 and 6, the number of triple points between metal crystal grains in a unit area of 1 mm×1 mm is preferably in the range of 20 or more and 150 or less, and more preferably in the range of 30 or more and 100 or less.

Through the above steps, a bonded body of the ceramic substrate 2 and the front metal plate 3 is produced. Next, a step of forming the front metal plate 3 in a circuit shape is performed. It is preferable to use an etching step for forming the circuit shape. The etching step includes an etching step of the front metal plate 3 and an etching step of the bonding layer. The circuit shape and the side surface shape of the front metal plate 3 can be controlled through the etching step of the front metal plate 3. In addition, the size of the bonding-layer protruding portion 4a can be controlled by the etching step of the bonding layer 4. Laser machining and honing are also effective as the step of forming the circuit shape.

Through the above steps, the ceramic circuit board 1 with metal plates 3 and 6 (or only the front metal plate 3) can be produced. Furthermore, a semiconductor element 7 is mounted on the ceramic circuit board 1 to form a semiconductor device 10. If necessary, the ceramic circuit board 1 is bonded by lead frame or wire bonding.

If necessary, a molding step using resin or gel is performed. Molding with resin means solidifying and sealing the resin. Molding with gel means sealing with jelly-like resin. In the present embodiment, it is assumed that molding with resin is employed. However, molding with gel may be employed instead of the molding with resin. The mold resin 8, which is formed by resin molding, serves to protect the semiconductor element and wiring. The mold resin 8 can suppress electric conduction and discharge between the front metal plates and between the front and rear metal plates. On the other hand, along with higher performance of the semiconductor element 7, the junction temperature has increased. Accordingly, the amount of heat transferred to the metal plates 3 and 6 increases. There is a difference in coefficient of thermal expansion among the ceramic substrate 2, the bonding-layer protruding portion 4a, and the metal plates 3 and 6. Therefore, the stress due to the difference in thermal expansion is large in the vicinity of the bonding-layer protruding portion. The ceramic circuit board 1 according to the embodiment can prevent the resin from peeling off because the angle BAC or the like is controlled. In other words, it is suitable for the ceramic circuit board 1 to be molded with resin.

Method performed in the resin molding step include a method using resin and a method using gel. Examples of the resin include an epoxy resin, a polyester resin, and a silicone resin. Examples of the molding method include a transfer molding method and a compression molding method.

EXAMPLES

Examples 1 to 10 and Comparative Examples 1 to 4

Silicon nitride substrates and alumina-zirconia substrates were prepared as ceramic substrates 2 according to Examples 1 to 10 and ceramic substrates according to Comparative Examples 1 to 4. The silicon nitride substrates were prepared with a thermal conductivity of 90 W/m·K and a three-point bending strength of 650 MPa. The alumina-zirconia substrates were prepared with a thermal conductivity of 25 W/m·K and a three-point bending strength of 550 MPa.

Oxygen-free copper plates (Cu) and pure aluminum plates (Al) were prepared as metal plates. Bonding brazing materials shown in Table 1 were prepared.

TABLE 1

| Types of Brazing Material | Composition (% by mass) |
|---|---|
| Brazing Material 1 | Ag(52), Cu(30), Sn(13), Ti(5) |
| Brazing Material 2 | Ag(50.9), Cu(26), Sn(15), Ti(8), C(0.1) |
| Brazing Material 3 | Ag(57), Cu(30), In(10), Ti(3) |
| Brazing Material 4 | Ag(60.5), Cu(28), In(8), Ti(3), Zr(0.5) |
| Brazing Material 5 | Al(95), Si(5) |
| Brazing Material 6 | Al(92.5), Si(7), Mg(0.5) |
| Brazing Material 7 | Cu(77), Sn(20), Ti(3) |

The brazing material was formed into a paste and applied to a ceramic substrate. A front metal plate was placed thereon. Bonding conditions are shown in Table 2.

A bonded body in which the front metal plate and the rear metal plate were bonded to both surfaces of the ceramic substrate was produced by the above method. The ceramic substrate and the metal plate had the same vertical and horizontal sizes.

Combinations of the ceramic substrate, the brazing material, the front metal plate, and the rear metal plate are as shown in Table 2.

TABLE 2

| | Metal Plate | | | Ceramic Substrate | |
|---|---|---|---|---|---|
| | Material | Thickness of Front Metal Plate [mm] | Thickness of Rear Metal Plate [mm] | Thickness [mm] | Material |
| Example 1 | Cu | 0.8 | 0.7 | 0.32 | Silicon Nitride |
| Example 2 | Cu | 0.8 | 0.7 | 0.32 | Silicon Nitride |
| Example 3 | Cu | 0.3 | 0.25 | 0.32 | Silicon Nitride |
| Example 4 | Al | 0.6 | 0.6 | 0.32 | Silicon Nitride |
| Example 5 | Cu | 0.8 | 0.7 | 0.32 | Alumina-Zirconia |
| Example 6 | Cu | 0.8 | 0.7 | 0.32 | Silicon Nitride |
| Example 7 | Cu | 0.8 | 0.7 | 0.635 | Silicon Nitride |
| Example 8 | Cu | 0.8 | 0.7 | 0.32 | Silicon Nitride |
| Example 9 | Cu | 0.8 | 0.7 | 0.32 | Silicon Nitride |
| Example 10 | Al | 0.6 | 0.5 | 0.32 | Silicon Nitride |
| Comparative Example 1 | Cu | 0.8 | 0.7 | 0.32 | Silicon Nitride |
| Comparative Example 2 | Cu | 0.8 | 0.7 | 0.635 | Silicon Nitride |
| Comparative Example 3 | Al | 0.6 | 0.6 | 0.32 | Silicon Nitride |
| Comparative Example 4 | Cu | 0.8 | 0.7 | 0.32 | Alumina-Zirconia |

| | Brazing Material | | Drying Temperature [degrees Celsius] | Load in Bonding [Pa] |
|---|---|---|---|---|
| | Thickness [μm] | Material | | |
| Example 1 | 20 | Brazing Material 1 | 50 | 600 |
| Example 2 | 30 | Brazing Material 2 | 80 | 600 |
| Example 3 | 35 | Brazing Material 3 | 60 | 1900 |
| Example 4 | 30 | Brazing Material 5 | 60 | 600 |
| Example 5 | 40 | Brazing Material 4 | 50 | 1900 |
| Example 6 | 30 | Brazing Material 1 | 60 | 1000 |
| Example 7 | 40 | Brazing Material 2 | 60 | 1000 |
| Example 8 | 20 | Brazing Material 2 | 50 | 1900 |
| Example 9 | 25 | Brazing Material 7 | 80 | 1900 |
| Example 10 | 30 | Brazing Material 6 | 80 | 1000 |
| Comparative Example 1 | 30 | Brazing Material 1 | 30 | 300 |
| Comparative Example 2 | 30 | Brazing Material 3 | 100 | 2500 |
| Comparative Example 3 | 30 | Brazing Material 5 | 60 | 400 |
| Comparative Example 4 | 30 | Brazing Material 4 | 60 | 1000 |

| | Temperature in Bonding [degrees Celsius] | Cooling Rate [degrees Celsius/min] |
|---|---|---|
| Example 1 | 810 | 6 |
| Example 2 | 810 | 6 |
| Example 3 | 810 | 10 |
| Example 4 | 610 | 6 |
| Example 5 | 810 | 6 |
| Example 6 | 810 | 8 |
| Example 7 | 810 | 6 |
| Example 8 | 810 | 6 |
| Example 9 | 860 | 10 |
| Example 10 | 620 | 6 |
| Comparative Example 1 | 810 | 3 |
| Comparative Example 2 | 810 | 6 |
| Comparative Example 3 | 610 | 6 |
| Comparative Example 4 | 810 | 4 |

An etching step was performed using the obtained bonded body. Through this step, the length of the bonding-layer protruding portion and the angle BAC were adjusted. Thus, a ceramic circuit board was produced. The front copper plate and the rear copper plate had the same shape with respect to the length of the bonding-layer protruding portion and the angle BAC.

An arbitrary cross section of the obtained ceramic circuit board was observed by SEM. The length of the bonding-layer protruding portion and the angle BAC were measured with SEM photographs. In addition, the Vickers hardness of the region M and the bonding layer was examined using a nanoindentation method. Further, the ratio R was measured using SEM-EDX.

The results are shown in Table 3.

TABLE 3

| | Angle BAC [degrees] | Length of Bonding-Layer Protruding Portion [μm] | Hm | Hb | Hm/Hb | R [%] |
|---|---|---|---|---|---|---|
| Example 1 | 140 | 50 | 150 | 100 | 1.5 | 5 |
| Example 2 | 150 | 75 | 135 | 95 | 1.4 | 5 |
| Example 3 | 145 | 40 | 177 | 120 | 1.5 | 15 |
| Example 4 | 135 | 30 | 82 | 64 | 1.3 | 6 |
| Example 5 | 140 | 70 | 143 | 83 | 1.7 | 10 |
| Example 6 | 140 | 25 | 123 | 93 | 1.3 | 4 |
| Example 7 | 130 | 60 | 136 | 106 | 1.3 | 8 |
| Example 8 | 155 | 25 | 260 | 145 | 1.8 | 15 |
| Example 9 | 155 | 25 | 281 | 151 | 1.9 | 19 |
| Example 10 | 135 | 120 | 110 | 96 | 1.1 | 10 |
| Comparative Example 1 | 120 | 40 | 320 | 100 | 1.2 | 4 |
| Comparative Example 2 | 100 | 50 | 140 | 111 | 1.3 | 9 |
| Comparative Example 3 | 120 | 15 | 90 | 78 | 1.2 | 6 |
| Comparative Example 4 | 125 | 100 | 139 | 89 | 1.6 | 30 |

As can be seen from Table 3, in the ceramic circuit boards according to Examples 1 to 10, when the length of the bonding-layer protruding portion was 20 μm or more and 150 μm or less, the angle BAC was 110 degrees or more, 300>Hm>Hb, Hm/Hb<2, and the ratio R was in the range of 5% or more and 20% or less.

On the other hand, Comparative Example 1 had a hardness Hm of more than 300. Comparative Example 2 had an angle BAC of less than 110 degrees. In Comparative Example 2, the length of the bonding-layer protruding portion was less than 20 μm. In Comparative Example 4, the ratio R exceeded 20%.

In Examples 1 to 10 and Comparative Examples 1 to 3, the number of triple points between metal crystal grains in a unit area of 1 mm×1 mm on the surface of the metal plate was in the range of 20 or more and 150 or less. In Comparative Example 4, the number of triple points between metal crystal grains in a unit area of 1 mm×1 mm was in the range of 2 or more and 12 or less.

Figure 4:
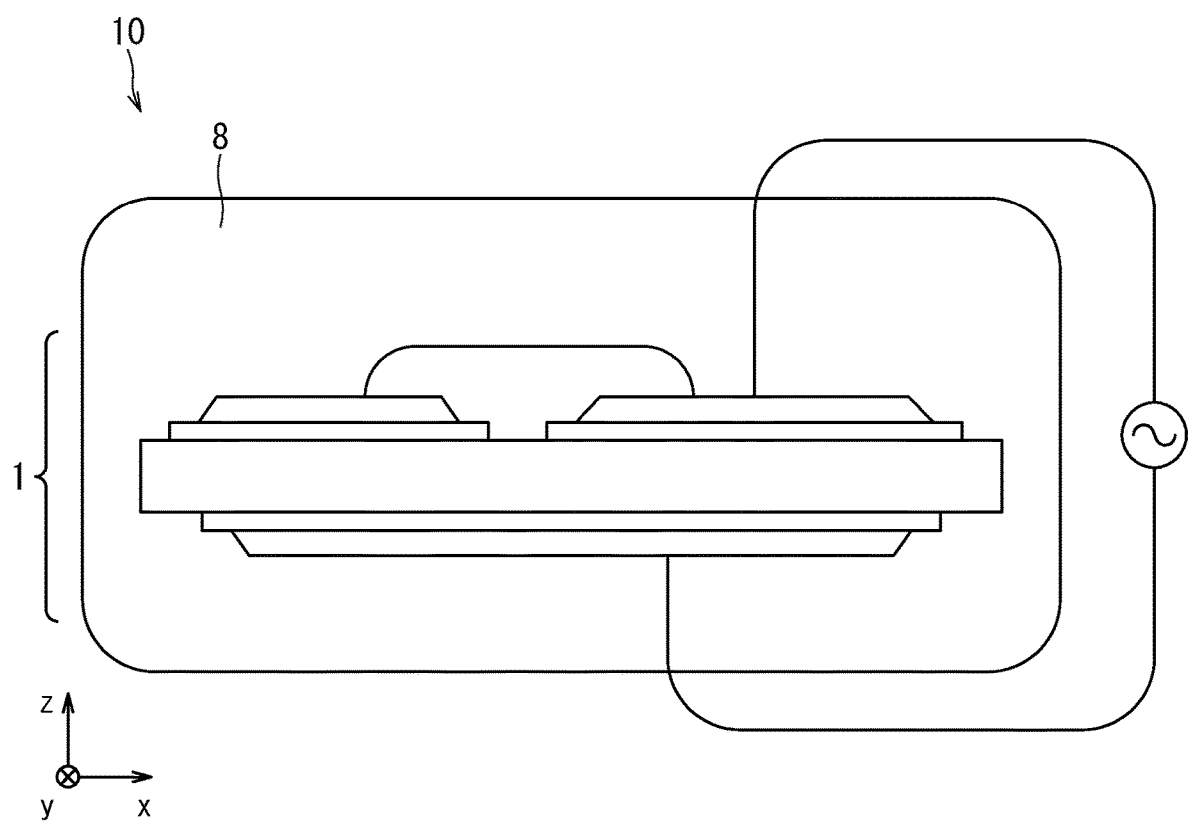
FIG. 4 is a side view for illustrating measurement of withstand voltage characteristics.

Next, TCT characteristics and withstand voltage characteristics of the ceramic circuit board were measured. First, the two front metal plates were short-circuited by wire bonding. Then, as shown in FIG. 4, a mold resin was formed by the transfer molding method so that the electrical potential of each of the front and rear metal plates could be taken externally. The TCT characteristics of the molded resin were evaluated. Under TCT conditions, one cycle includes –40 degrees Celsius×30 min, room temperature×10 min, 250 degrees Celsius×30 min, and room temperature×10 min in that order. TCT tests were performed for 1,000 cycles and 3,000 cycles.

After the TCT test, the peeling rate associated with crack occurrence between the metal plate and the ceramic was measured by scanning acoustic tomography (SAT). The peeling rate includes both peeling of the metal plate and peeling of the mold resin.

Furthermore, withstand voltage between the front and rear copper plates was evaluated by application of AC 50 Hz for 60 sec. The withstand voltage was measured on samples after 3,000 cycles of TCT. The withstand voltage evaluation was started by applying a voltage of 500 V, and the voltage was increased by 500 V stepwisely after the withstand voltage evaluation was passed at each voltage. This was carried out until dielectric breakdown occurred, and the maximum voltage value at which dielectric breakdown did not occur was taken as the withstand voltage value.

The results are shown in Table 4.

TABLE 4

|  | After 1,000 cycles | After 3,000 cycles | |
|---|---|---|---|
|  | Peeling Area Rate [%] | Peeling Area Rate [%] | Withstand Voltage [kV] |
| Example 1 | 0 | 1 | 9.0 |
| Example 2 | 0 | 0 | 9.5 |
| Example 3 | 0 | 0 | 9.5 |
| Example 4 | 0 | 0 | 9.5 |
| Example 5 | 0 | 3 | 9.0 |
| Example 6 | 0 | 2 | 9.0 |
| Example 7 | 0 | 1 | 13.0 |
| Example 8 | 0 | 0 | 9.5 |
| Example 9 | 0 | 0 | 9.5 |
| Example 10 | 0 | 1 | 9.0 |
| Comparative Example 1 | 1 | 12 | 2.5 |
| Comparative Example 2 | 2 | 16 | 4.0 |
| Comparative Example 3 | 1 | 11 | 4.5 |
| Comparative Example 4 | 2 | 24 | 1.5 |

As can be seen from Table 4, there was no significant difference after 1,000 cycles, but there was a significant difference after 3,000 cycles. Therefore, it was found that the ceramic circuit boards according to Examples 1 to 10 had excellent reliability even with the resin mold. In contrast, resin peeling was observed everywhere in Comparative Examples 1 to 4.

As described above, according to the ceramic circuit board 1 and the semiconductor device 10 using the same, the resin peeling of the mold resin 8 can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A ceramic circuit board comprising a ceramic substrate and a metal plate bonded together via a bonding layer, wherein
when the ceramic circuit board is observed through a cross-section defined by a thickness direction and lateral direction of the ceramic circuit board:
a side surface of the metal plate has an inclined shape;
the bonding layer has a bonding-layer protruding portion which protrudes by 20 μm or more and 150 μm or less from an edge where the bonding layer is in contact with the side surface of the metal plate;
an angle BAC is 110 degrees or more, where a point A is on the edge, a point B is on a side surface of the metal plate that is 20 μm away from the point A inward in the lateral direction, and a point C is on a surface of the bonding-layer protruding portion that is 20 μm away from the point A outward in the lateral direction;
Hm denotes an average value of Vickers hardness at ten locations in a region between a line in the lateral direction passing through the point B and an interface between the metal plate and the bonding layer;
300>Hm>Hb and Hm/Hb<2, where Hb denotes an average value of Vickers hardness at ten locations in the bonding layer; and
a ratio R of an area where a component of the bonding layer other than that of the metal plate is present in the region is 5% or more and 20% or less.

2. The ceramic circuit board according to claim 1, wherein a length of the bonding-layer protruding portion is in a range of 20 μm or more and 80 μm or less.

3. The ceramic circuit board according to claim 1, wherein the metal plate is made of any one of Cu, Al, and an alloy containing these metals.

4. The ceramic circuit board according to claim 1, wherein the metal plate has a thickness of 0.3 mm or more.

5. The ceramic circuit board according to claim 3, wherein the metal plate has a thickness of 0.3 mm or more.

6. The ceramic circuit board according to claim 1, wherein the component of the bonding layer other than that of the metal plate in a region M is one or more selected from Ag, Ti, Sn, In, Zr, Al, Si, C, and Mg.

7. The ceramic circuit board according to claim 5, wherein the component of the bonding layer other than that of the metal plate in a region M is one or more selected from Ag, Ti, Sn, In, Zr, Al, Si, C, and Mg.

8. The ceramic circuit board according to claim 1, wherein the ceramic substrate is a silicon nitride substrate having a thermal conductivity of 80 W/m·K or more.

9. The ceramic circuit board according to claim 1, wherein the bonding layer has a Vickers hardness Hb of 90 or more and 200 or less.

10. The ceramic circuit board according to claim 7, wherein the bonding layer has a Vickers hardness Hb of 90 or more and 200 or less.

11. The ceramic circuit board according to claim 1, wherein a number of triple points between metal crystal grains in a unit area of 1 mm×1 mm on a surface of the metal plate is in a range of 20 or more and 150 or less.

12. The ceramic circuit board according to claim 10, wherein a number of triple points between metal crystal grains in a unit area of 1 mm×1 mm on a surface of the metal plate is in a range of 20 or more and 150 or less.

13. A semiconductor device comprising a semiconductor element mounted on the ceramic circuit board according to claim 1.

14. A semiconductor device comprising a semiconductor element mounted on the ceramic circuit board according to claim 12.

15. The semiconductor device according to claim 13, wherein the semiconductor device is molded with resin or gel.

16. The semiconductor device according to claim 14, wherein the semiconductor device is molded with resin or gel.

* * * * *